(12) United States Patent
Kamiyama et al.

(10) Patent No.: US 9,203,358 B2
(45) Date of Patent: Dec. 1, 2015

(54) RADIO FREQUENCY AMPLIFIER CIRCUIT

(71) Applicant: Panasonic Corporation, Osaka (JP)

(72) Inventors: Tomohide Kamiyama, Osaka (JP);
Hiroshi Naitou, Osaka (JP); Takashi Uno, Hyogo (JP); Motoyoshi Iwata, Osaka (JP); Kazuhiro Yahata, Osaka (JP); Hikaru Ikeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 10 days.

(21) Appl. No.: 14/233,242

(22) PCT Filed: Mar. 15, 2013

(86) PCT No.: PCT/JP2013/001754
§ 371 (c)(1),
(2) Date: Jan. 16, 2014

(87) PCT Pub. No.: WO2013/175690
PCT Pub. Date: Nov. 28, 2013

(65) Prior Publication Data
US 2014/0191809 A1 Jul. 10, 2014

(30) Foreign Application Priority Data
May 25, 2012 (JP) ................... 2012-120094

(51) Int. Cl.
*H03F 1/56* (2006.01)
*H03F 3/60* (2006.01)
(Continued)

(52) U.S. Cl.
CPC *H03F 1/56* (2013.01); *H01L 23/66* (2013.01); *H03F 1/565* (2013.01); *H03F 3/601* (2013.01);
(Continued)

(58) Field of Classification Search
CPC ............... H01L 2924/1305; H01L 2924/1306; H01L 23/66; H01L 2924/3011; H01L 2223/6611; H01L 2223/6655; H01L 2223/6644; H01L 2224/49175; H03F 3/195; H03F 3/245; H03F 3/193; H03F 2200/387; H03F 1/56
USPC ...................................... 330/66, 67, 302, 307
See application file for complete search history.

(56) References Cited

U.S. PATENT DOCUMENTS

| 6,396,342 | B1 | 5/2002 | Takenaka | |
| 7,564,303 | B2 * | 7/2009 | Perugupalli et al. | 330/307 |
| 8,299,857 | B2 * | 10/2012 | Keshishian | 330/302 |

FOREIGN PATENT DOCUMENTS

| JP | 2001-111364 | 4/2001 |
| JP | 2001-230640 | 8/2001 |

(Continued)

OTHER PUBLICATIONS

International Search Report issued May 7, 2013 in International Application No. PCT/JP2013/001754.

*Primary Examiner* — Khanh V Nguyen
(74) *Attorney, Agent, or Firm* — Wenderoth, Lind & Ponack, L.L.P.

(57) ABSTRACT

A radio frequency amplifier circuit includes a transistor and an output-side matching circuit. The output-side matching circuit includes a first distributed constant line to which a radio frequency signal from the transistor is transmitted, a flat plate lead terminal transmitting the radio frequency signal from the first distributed constant line to an outside of the package, and a capacitive element having one electrode that is connected to the lead terminal and the other electrode that is grounded. A back surface of the lead terminal is joined to a resin substrate, and the capacitive element and the first distributed constant line are disposed adjacent to each other, with an alignment direction of the capacitive element and the first distributed constant line intersecting an alignment direction of the first distributed constant line and the lead terminal.

7 Claims, 9 Drawing Sheets

(51) Int. Cl.
*H01L 23/66* (2006.01)
*H03F 3/191* (2006.01)

(52) U.S. Cl.
CPC . *H01L 2223/6611* (2013.01); *H01L 2223/6655* (2013.01); *H01L 2224/48091* (2013.01); *H01L 2224/48137* (2013.01); *H01L 2224/49175* (2013.01); *H01L 2224/73265* (2013.01); *H03F 3/191* (2013.01)

(56) References Cited

FOREIGN PATENT DOCUMENTS

| | | |
|---|---|---|
| JP | 2003-115732 | 4/2003 |
| JP | 2006-122095 | 5/2006 |
| JP | 2007-295367 | 11/2007 |
| WO | 2007/119266 | 10/2007 |

\* cited by examiner

RADIO FREQUENCY AMPLIFIER CIRCUIT

TECHNICAL FIELD

The present invention relates to a radio frequency amplifier circuit and in particular, the configuration of a matching circuit connected to an output side of the radio frequency amplifier circuit.

BACKGROUND ART

In general, a radio frequency amplifier circuit has a configuration in which unit transistors are connected in parallel for the purpose of achieving a high power. As a result, the input and output impedances are low. For example, when the output exceeds 100 W, the input and output impedances are sometimes 3Ω or lower. Resulting impedance mismatching with an external circuit normalized to 50Ω to which the radio frequency amplifier circuit is to be connected requires a matching circuit to be connected to an input side and an output side of the radio frequency amplifier circuit.

The matching circuit for matching the low impedance of the nearly short-circuited radio frequency amplifier circuit to 50Ω is configured, for example, by the combination of an inductive element having wires and distributed constant lines connected in series with a signal path and a capacitive element having capacitors connected in parallel with the signal path.

Conventional matching circuits have configurations as illustrated in Patent Literatures (PTLs) 1 and 2, for example.

FIG. 8 illustrates the configuration inside a package of the conventional high power amplifier described in PTL 1. The high power amplifier described in this figure includes a transistor 801, an input-side matching circuit 802 and an output-side matching circuit 803. The input-side matching circuit 802 and the output-side matching circuit 803 each have a lead terminal 804. The lead terminal 804 takes out a signal from each matching circuit to an outside of a package frame 805.

The input-side matching circuit 802 has a configuration in which a parallel circuit including resistors 806 and a capacitor 807 and a distributed constant line are connected in series and the parallel circuit and the distributed constant line are further connected to a lead terminal. This configuration can stabilize the circuit, thus preventing oscillations. Also, the configuration in which the plural resistors 806 are provided for the capacitor 807 allows the resistance value to be varied according to the connection positions of wires, making it possible to adjust circuit characteristics easily after mounting.

On the other hand, the output-side matching circuit 803 includes a first distributed constant line, a second distributed constant line and the lead terminal 804 in this order from the vicinity of the transistor 801. It is noted that the distributed constant lines may be operated as a parallel plate capacitor.

FIGS. 9A and 9B respectively illustrate the configuration of a conventional radio frequency amplifier described in PTL 2. The radio frequency amplifier described in FIG. 9A includes a transistor 901, an input-side matching circuit 902 and an output-side matching circuit 903A. The output-side matching circuit 903A has a configuration in which distributed constant lines 904 and 906 constituted by high-dielectric substrates and a distributed constant line 905 constituted by a dielectric substrate different from the high-dielectric substrates are cascaded using wires. Similarly to the output-side matching circuit 803 in FIG. 8, for the transformation from a low impedance to a high impedance, the wires and the distributed constant lines also functioning as the parallel plate capacitor are constituted in three stages, thereby ensuring an electrical length. In the case where the high-dielectric substrates constituting the distributed constant lines 904 and 906 are the same in relative dielectric constant and thickness, the distributed constant lines 904 and 906 can be formed of a single high-dielectric substrate 910 as shown in FIG. 9B. Part of the structural components of the output-side matching circuit 903A in FIG. 9A can be formed on the single substrate as those of the output-side matching circuit 903B in FIG. 9B, making it possible to reduce the longitudinal size of the matching circuit without changing the configuration thereof.

CITATION LIST

Patent Literature

[PTL 1]
WO 2007-119266
[PTL 2]
Japanese Unexamined Patent Application Publication No. 2007-295367

SUMMARY OF INVENTION

Technical Problem

However, in the conventional high power amplifier described in PTL 1, since the matching circuits provided in multiple stages are cascaded, the circuit size tends to increase. Accordingly, the package receiving the circuits becomes larger and costly.

Further, in the conventional radio frequency amplifier described in PTL 2, since the plural distributed constant lines are constituted in the single substrate, the miniaturization is possible. In this case, however, the above-noted distributed constant lines have to have the same relative dielectric constant and substrate thickness, thus lowering the design flexibility. Also, when assuming a high power transistor 901 in which a plurality of unit transistors are connected in parallel while further considering the signal flow therein, the unit transistor disposed at the center and that disposed at the end in the transistor 901 have different electrical lengths along the distributed constant lines 904, 905A, 905B and 906. Therefore, the matching becomes uneven among the unit transistors. This matching unevenness causes a transmission loss in the matching circuits. FIG. 9B indicates an exemplary difference in the electrical length by dotted arrows.

With the above-described problems in mind, it is an object of the present invention to provide a radio frequency amplifier circuit that is miniaturized and has a matched impedance.

Solution to Problem

In order to solve the problems described above, a radio frequency amplifier circuit according to one aspect of the present invention includes, on a mounting surface inside a package, a transistor amplifying a radio frequency signal, an input-side matching circuit, and an output-side matching circuit. The output-side matching circuit includes a first distributed constant line to which the radio frequency signal from the transistor is transmitted via a plurality of first wires arranged in parallel, a lead terminal in a flat plate shape to which the radio frequency signal from the first distributed constant line is transmitted via a plurality of second wires arranged in parallel, the lead terminal transmitting the radio frequency signal to an outside of the package, and a capacitive element having one electrode that is connected to the lead terminal via a third wire and an other electrode that is grounded. The lead terminal is partially joined to a sealing resin having a lower dielectric constant than the first distributed constant line, and the capacitive element and the first distributed constant line are disposed adjacent to each other, with an alignment direction of the capacitive element and the first distributed constant line intersecting, on the mounting surface, an alignment direction of the first distributed constant line and the lead terminal.

Advantageous Effects of Invention

With the radio frequency amplifier circuit according to the present invention, a signal is transmitted between the first distributed constant line and the capacitive element through the lead terminal partially covered with a low-dielectric resin. Further, since the package is mounted on a metallic measurement jig so as to serve as a ground plane, the lead terminal functions as a microstrip line having a low dielectric constant, making it possible to reduce the electrical length from the first distributed constant line to the capacitive element compared with the case of using a high-dielectric material. Therefore, since the variations in electrical length can be reduced between the signal transmission paths present in parallel on the distributed constant line, the loss of the matching circuit can be reduced. Further, since the capacitive element is disposed so as to intersect, on a mounting surface, the direction in which the first distributed constant line and the lead terminal are aligned, the circuit size is reduced in the transmission direction of a radio frequency signal, thus achieving a smaller area. Accordingly, it becomes possible to both miniaturize the matching circuit and ensure the device performance.

DESCRIPTION OF EMBODIMENTS

Figure 1:
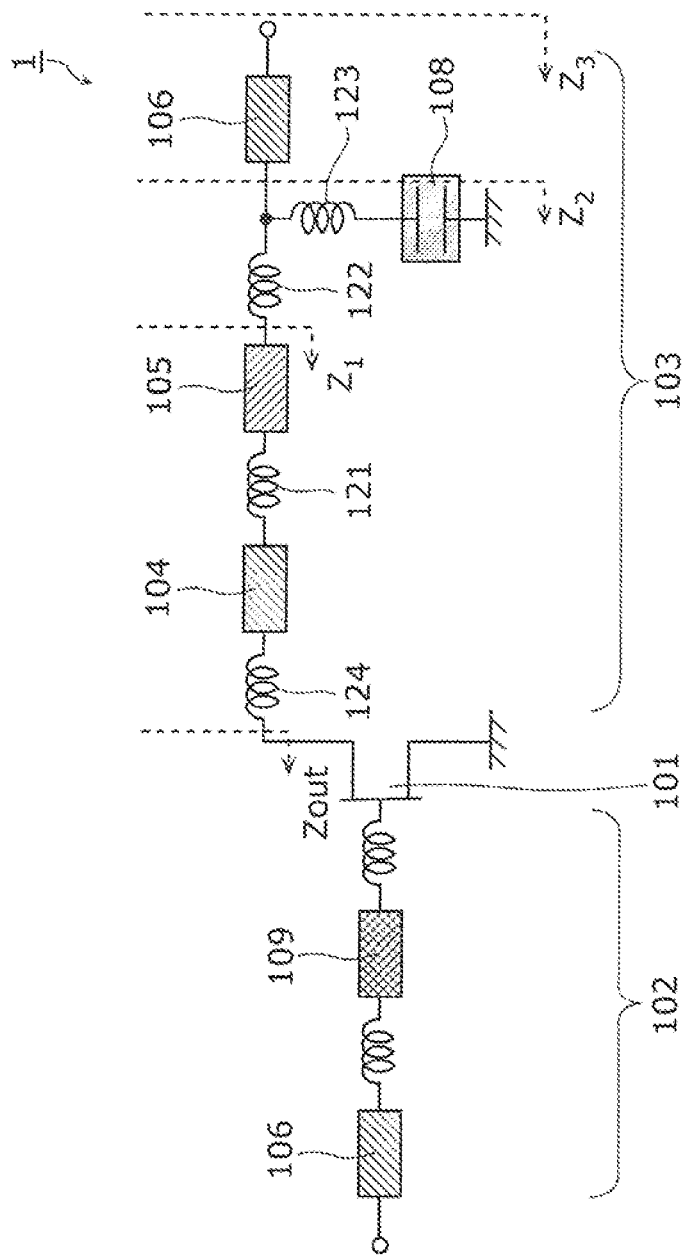
FIG. 1 illustrates a circuit configuration of a radio frequency amplifier circuit according to Embodiment 1.

A radio frequency amplifier circuit according to one aspect of the present invention includes, on a mounting surface inside a package, a transistor amplifying a radio frequency signal, an input-side matching circuit, and an output-side matching circuit. The output-side matching circuit includes a first distributed constant line to which the radio frequency signal from the transistor is transmitted via a plurality of first wires arranged in parallel, a lead terminal in a flat plate shape to which the radio frequency signal from the first distributed constant line is transmitted via a plurality of second wires arranged in parallel, the lead terminal transmitting the radio frequency signal to an outside of the package, and a capacitive element having one electrode that is connected to the lead terminal via a third wire and an other electrode that is grounded. The lead terminal is partially joined to a sealing resin having a lower dielectric constant than the first distributed constant line, and the capacitive element and the first distributed constant line are disposed adjacent to each other, with an alignment direction of the capacitive element and the first distributed constant line intersecting, on the mounting surface, an alignment direction of the first distributed constant line and the lead terminal.

According to this aspect, a signal is transmitted between the first distributed constant line and the capacitive element through the lead terminal joined with a low-dielectric resin. Thus, the lead terminal functions as a microstrip line having a low dielectric constant, making it possible to reduce the electrical length from the first distributed constant line to the capacitive element. Here, the substrates of the matching circuit are connected to each other with a plurality of wires arranged in parallel. Then, the above reduction of the electrical length can lessen the variations in electrical length between a plurality of signal transmission paths present in parallel on the distributed constant line, so that the loss of the matching circuit can be reduced. Further, since the capacitive element is disposed so as to intersect, on a mounting surface, the direction in which the first distributed constant line and the lead terminal are aligned, the circuit size is reduced in the transmission direction of a radio frequency signal, thus achieving a smaller area. Accordingly, it becomes possible to both miniaturize the matching circuit and ensure the device performance.

Also, for example, a second distributed constant line may be further disposed between the first distributed constant line and the transistor, the second distributed constant line being connected to the transistor via a plurality of fourth wires arranged in parallel and being connected to the first distributed constant line via the plurality of first wires.

With this aspect, the distributed constant lines having different dielectric constants can be cascaded, so that the matching circuit can increase the flexibility of impedance matching.

Also, for example, the first distributed constant line and the capacitive element may be formed of a single continuous dielectric substrate.

In this manner, the number of substrates in the matching circuit can be reduced, so that the mounting becomes easier, thus allowing the cost reduction and simplification in a manufacturing process. Further, since the first distributed constant line and the above-noted capacitive element are constituted by the single dielectric substrate, they can be disposed adjacent to each other without providing any unnecessary region along a direction on a mounting surface intersecting the direction in which the first distributed constant line and the lead terminal are aligned. Therefore, it becomes possible to reduce the circuit size not only in the transmission direction of a radio frequency signal but also in a direction intersecting that transmission direction.

Further, for example, a plurality of the capacitive elements may be disposed symmetrically on both sides along the intersecting direction of the first distributed constant line.

In this manner, the capacitive elements are disposed symmetrically so as to operate evenly. Accordingly, it is possible to suppress unwanted reflections, thus reducing the loss of the matching circuit.

Additionally, for example, a plurality of the transistors may be provided, and a plurality of unit transmission lines, each of which is constituted by the first distributed constant line and the capacitive element and provided for a different one of the transistors, may be disposed in parallel between the plurality of the transistors and the lead terminal.

This makes it possible to reduce the chip size of the transistor, so that the warping of each transistor on the mounting surface can be suppressed, thus improving the adhesion between the above-noted mounting surface and each transistor. In this manner, the heat dissipation performance of each transistor can be improved. Thus, the mounting yield increases, making it possible to achieve a cost reduction.

Further, for example, the unit transmission lines that are adjacent to each other may be connected via a resistor.

This makes it possible to prevent oscillations, which may be generated during the power combination of unit transmission lines disposed in parallel.

In the following, a radio frequency amplifier circuit according to one aspect of the present invention will be described with reference to accompanying drawings. In the figures below, the same structural components are assigned the same reference signs.

It should be noted that every embodiment described below illustrates one preferable specific example of the present invention. The numerals, shapes, materials, structural components, and arrangements and connections of the structural components indicated in the following embodiments are merely an example and not intended to limit the present invention. Further, among the structural components in the following embodiments, the one that is not recited in an independent claim exhibiting the most generic concept of the present invention will be described as an arbitrary structural component constituting a more preferable mode.

EMBODIMENT 1

FIG. 1 illustrates a circuit configuration of a radio frequency amplifier circuit according to Embodiment 1. A radio frequency amplifier circuit 1 according to the present embodiment includes a transistor 101, an input-side matching circuit 102 and an output-side matching circuit 103.

The transistor 101 has a configuration in which unit transistors are connected in parallel for the purpose of achieving a high power. As a result, the input and output impedances are low. For example, when the output exceeds 100 W, the input and output impedances are sometimes several ohms or lower. Therefore, when the transistor 101 is connected directly to an external circuit normalized to 50Ω, impedance mismatching occurs. In order to resolve this mismatching, the input side and the output side of the transistor 101 are connected to the input-side matching circuit 102 and the output-side matching circuit 103, respectively. The transistor 101 is an amplifier formed of a material such as, for example, Si, GaAs and GaN. The transistor may be of any kinds such as FET or HFET.

The output-side matching circuit 103 includes a second distributed constant line 104, a first distributed constant line 105, a lead terminal 106 for transmitting a signal to an outside of a package 112 receiving the radio frequency amplifier circuit, and a capacitive element 108. An output terminal of the transistor 101 and an input side of the second distributed constant line 104 are connected by a fourth wire 124. An output side of the second distributed constant line 104 and an input side of the first distributed constant line 105 are connected by a first wire 121. An output side of the first distributed constant line 105 and an input side of the lead terminal 106 are connected by a second wire 122. One electrode of the capacitive element 108 and the input side of the lead terminal 106 are connected by a third wire 123. Additionally, the other electrode of the capacitive element 108 is grounded.

The configuration of the input-side matching circuit 102 is not particularly limited. Any configuration is appropriate as long as the impedance is transformed and the input-side matching circuit 102 is disposed between the transistor 101 and the lead terminal 106.

Figure 2:
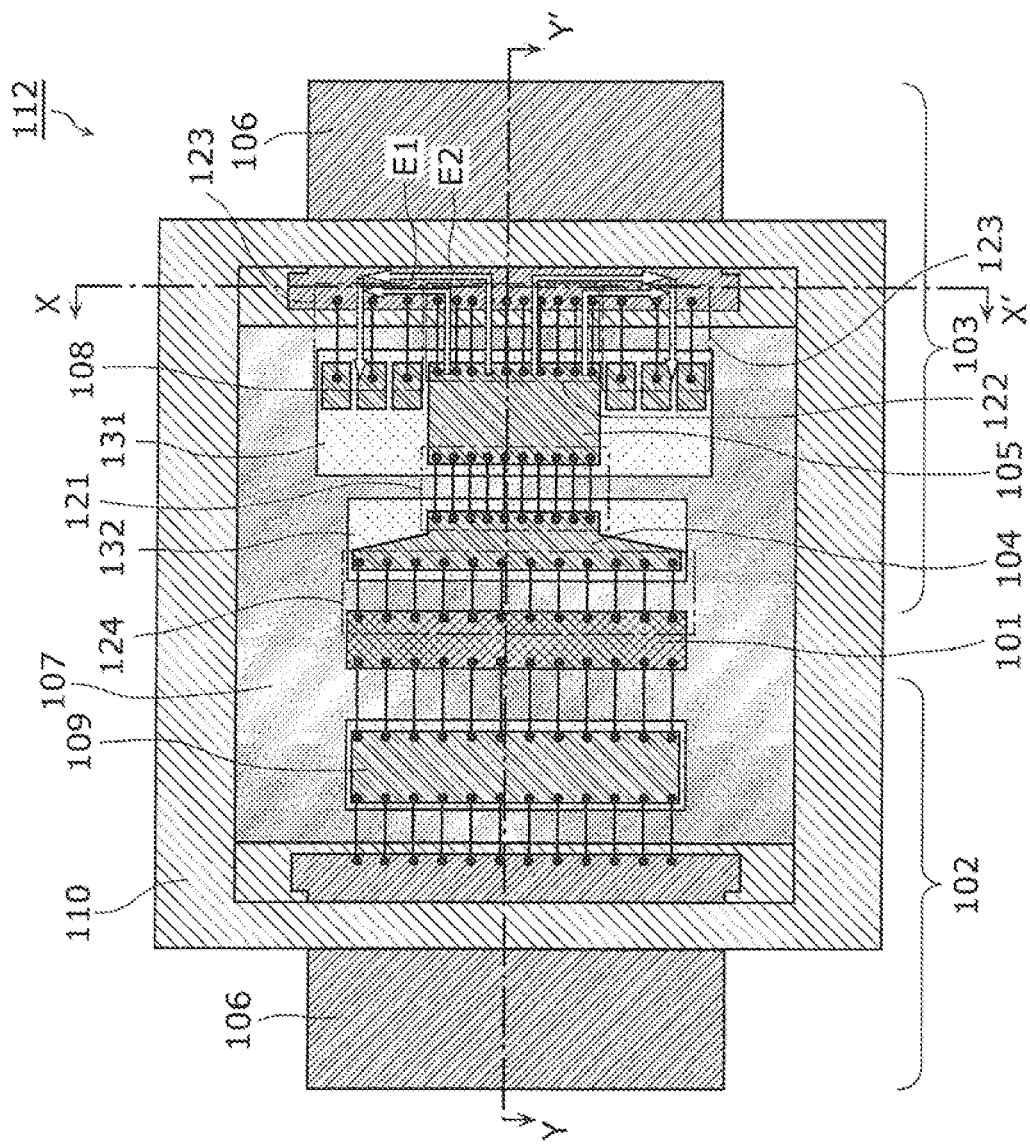
FIG. 2 illustrates a layout of the radio frequency amplifier circuit according to Embodiment 1.

FIG. 2 illustrates a layout of the radio frequency amplifier circuit according to Embodiment 1. The radio frequency amplifier circuit 1 shown in this figure includes the transistor 101 amplifying a radio frequency signal, the input-side matching circuit 102 and the output-side matching circuit 103 on a base substrate 107 in the package 112. Also, in order to increase its heat dissipation, the transistor 101 is joined via an electrically-conductive material such as AuSn or AuSi when being mounted on the base substrate 107. In the present embodiment, the above-noted electrically-conductive material is formed on the mounting surface in the package 112 on which the transistor 101 is to be mounted. The base substrate 107 including the mounting surface of the package 112 on which the transistor 101 is formed is formed of an electrically-conductive metal, for example.

A radio frequency signal from the transistor 101 is transmitted to the first distributed constant line 105 via a plurality of the first wires 121 arranged in parallel. The first distributed constant line 105 forms a microstrip line constituted by a dielectric substrate 131, an electrically-conductive film formed on the dielectric substrate 131 and the base substrate including the mounting surface on which the dielectric substrate 131 is mounted, for example.

The second distributed constant line 104 is disposed between the first distributed constant line 105 and the transistor 101. The second distributed constant line 104 is connected to the transistor 101 via a plurality of the fourth wires 124 arranged in parallel and to the first distributed constant line 105 via a plurality of the first wires 121. The second distributed constant line 104 forms a microstrip line constituted by a dielectric substrate 132, an electrically-conductive film formed on the dielectric substrate 132 and the base substrate on which the dielectric substrate 132 is mounted, for example.

In the present embodiment, the second distributed constant line 104 has an equivalent line width to the transistor 101 on the side close to the transistor 101 and an equivalent line width to the first distributed constant line 105 on the side close to the first distributed constant line 105. However, the line width of the second distributed constant line 104 may be different from the relationship described above depending on active devices such as the transistor 101 and transmission lines to be used. The line width may be the same at both ends, or the line width may be smaller on the side close to the transistor 101.

The lead terminal 106 of the output-side matching circuit 103 has a flat plate shape, receives a radio frequency signal from the first distributed constant line 105 via a plurality of the second wires 122 arranged in parallel and transmits the radio frequency signal to the outside of the package 112. To enhance viewability, FIG. 2 shows the state in which the lead terminal 106 is not covered with a sealing resin 110. However, when seen as a sealed package, the lead terminal 106 is partially embedded in the sealing resin 110.

The capacitive element 108 has a structure provided by sandwiching a dielectric material with parallel plates, for example. One electrode of the capacitive element 108 is connected to the lead terminal 106 via the third wire 123, and the other electrode is grounded to the base substrate 107. The capacitive element 108 forms a parallel plate capacitor constituted by the dielectric substrate 131, the electrically-conductive film formed on the dielectric substrate 131 and the base substrate 107 on which the dielectric substrate 131 is mounted, for example. Further, in the present embodiment, the dielectric forming the capacitive element 108 is provided by a single substrate that is continuous with the dielectric substrate 131 constituting the first distributed constant line 105. The capacitive element 108 is connected to the first distributed constant line 105 via the lead terminal 106 and the third wire 123. Although the capacitive element 108 does not have a unitary structure but has a configuration in which a plurality of unit capacitors are connected in parallel in FIG. 2, there is no limitation as to the number of divided capacitive elements 108. It is preferable that the capacitive elements 108 are disposed symmetrically on both sides along a direction intersecting the transmission direction of the first distributed constant line 105. In this manner, the capacitive elements are allowed to operate evenly. Accordingly, it is possible to suppress unwanted reflections, thus reducing the loss of the matching circuit, The input-side matching circuit 102 includes a third distributed constant line 109 and the lead terminal 106 for transmitting a signal from an outside of the package 112 receiving the radio frequency amplifier circuit. An input terminal of the transistor 101 and an output side of the third distributed constant line 109 are connected by a plurality of wires arranged in parallel. The third distributed constant line 109 forms a microstrip line constituted by a dielectric substrate, an electrically-conductive film formed on the dielectric substrate and a base substrate on which the dielectric substrate is mounted, for example.

A conventional radio frequency amplifier circuit has had a configuration in which the capacitive element 108 is connected directly to the first distributed constant line 105 via wires. In this case, the circuit size inevitably increases in the signal transmission direction. Further, a configuration has been assumed where the capacitive element 108 and the first distributed constant line 105 are formed on a single substrate and the capacitive element 108 is disposed along a direction intersecting the direction in which the first distributed constant line 105 and the lead terminal 106 are aligned. Even with this configuration, the above-described conventional configuration in which the first distributed constant line 105 and the capacitive element 108 are connected directly via the wires causes a problem that variations in electrical lengths lead to an increase in the matching loss, similarly to PTL 2. In order to solve the problem of increasing matching loss due to the variations in the electrical length, it is effective to lower the relative dielectric constant of the first distributed constant line 105. In this case, however, the amount of impedance transformation decreases, making it necessary to extend the line length further in order to secure the transformation amount at a low dielectric constant. This lowers the flexibility as the matching circuit for achieving higher impedance. Therefore, it is not recommended to reduce the electrical length by lowering the relative dielectric constant of the first distributed constant line 105.

In contrast, the output-side matching circuit 103 according to Embodiment 1 of the present invention has the following configuration so as to solve the above-described problem.

As shown in the layout of FIG. 2, the first distributed constant line 105 and the capacitive element 108 are electrically connected via the lead terminal 106 covered with a low-dielectric resin. Further, the capacitive element 108 and the first distributed constant line 105 are disposed adjacent to each other so that an alignment direction of the capacitive element 108 and the first distributed constant line 105 intersects, on the above-noted mounting surface, an alignment direction of the first distributed constant line 105 and the lead terminal 106 of the output-side matching circuit 103. This reduces the electrical length of the signal transmission path between the first distributed constant line 105 and the capacitive element 108 and the circuit size in the transmission direction of a radio frequency signal, thus achieving a smaller area. Accordingly, it becomes possible to both miniaturize the matching circuit and ensure the device performance.

Figure 3A:
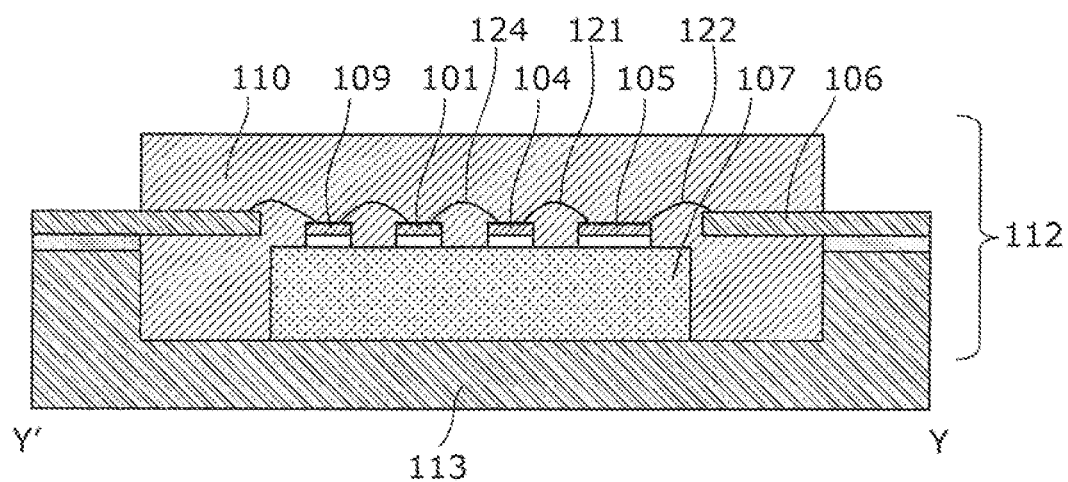
FIG. 3A is a structural sectional view taken along a line Y-Y' in the radio frequency amplifier circuit according to Embodiment 1.
Figure 3B:
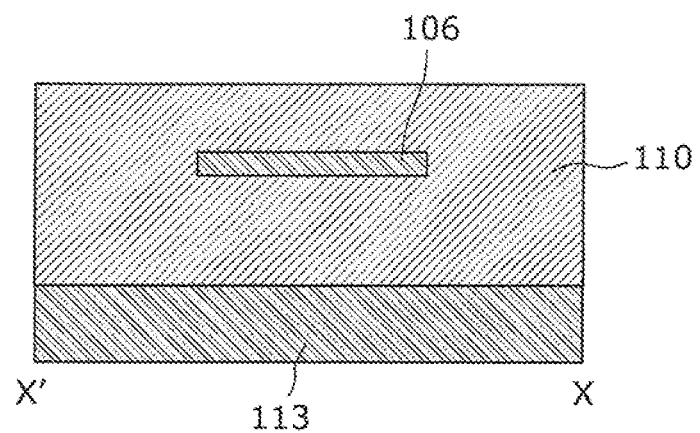
FIG. 3B is a structural sectional view taken along a line X-X' in the radio frequency amplifier circuit according to Embodiment 1.

FIG. 3A is a structural sectional view taken along a line Y-Y' in the radio frequency amplifier circuit according to Embodiment 1. Further, FIG. 3B is a structural sectional view taken along a line X-X' in the radio frequency amplifier circuit according to Embodiment 1. It is noted that not only the package 112 but also a measurement jig 113 is shown. It is preferable that the measurement jig 113 has a low heat resistance in order to radiate heat from the transistor 101 to the outside through the base substrate 107. Accordingly, a metal material such as Cu or Al are used, for example. The measurement jig 113 includes a recessed portion for receiving the package 112. In order to avoid contact failure between the lead terminal 106 of the package 112 and a conductor portion of the measurement jig 113, a screw or a pressing jig may be used. The package 112 is mounted on the measurement jig 113, so that a region of the lead terminal 106 covered with the sealing resin 110 can operate as a microstrip line with the metal in the measurement jig 113 serving as a ground. In a general ceramic package, its ceramic substrate has a high relative dielectric constant of about 10, whereas the resin has a low relative dielectric constant of 5 or lower. The microstrip line constituted by the lead terminal 106, the low-dielectric resin and the ground of the measurement jig 113 is applied to the signal transmission path from the first distributed constant line 105 to the capacitive element 108, thereby reducing the electrical length of the signal transmission path compared with the case where this signal transmission path is formed of a high-dielectric substrate. Consequently, it becomes possible to reduce variations in the electrical length between a plurality of signal transmission paths (E1 and E2 in FIG. 2) generated from the first distributed constant line 105 to the capacitive element 108, so that the matching loss in the output-side matching circuit 103 can be reduced. It is noted that, in FIGS. 3A and 3B, the lead terminal 106 and the measurement jig 113 contact each other via the dielectric substrate. Additionally, the sectional views of FIGS. 3A and 3B show the state after the resin sealing.

As an end product, the package 112 may be mounted directly on the mounting substrate without being fixed to the above-noted measurement jig 113. In this case, the package 112 is mounted on a ground of the mounting substrate, whereby a structure in which the sealing resin 110 is sandwiched between the lead terminal 106 and that ground forms a microstrip structure.

Figure 4:
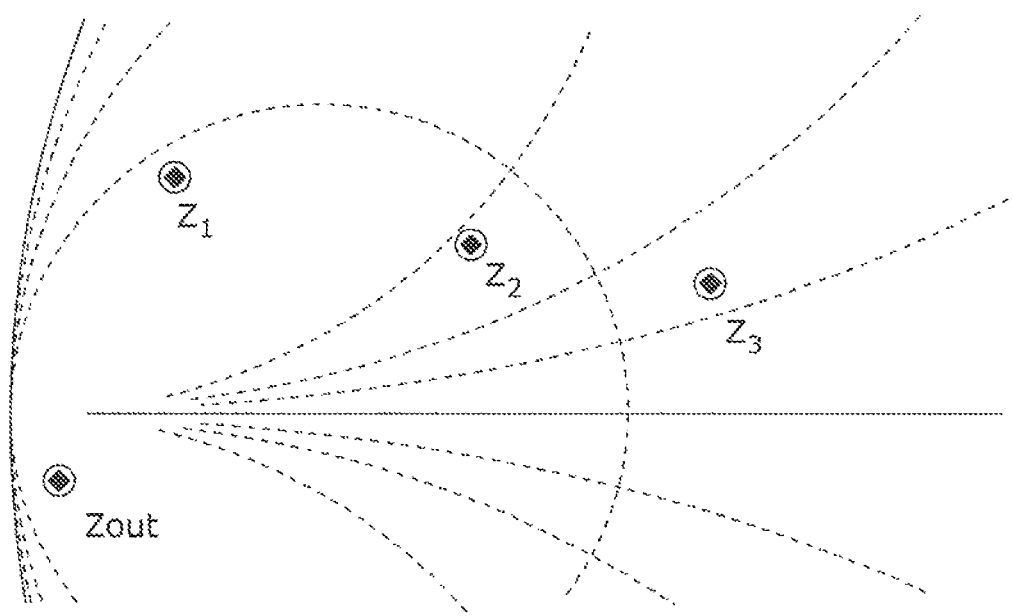
FIG. 4 is an admittance chart showing an impedance transformation of a matching circuit according to Embodiment 1.

FIG. 4 is an admittance chart showing an impedance transformation of a matching circuit according to Embodiment 1. In the admittance chart shown in this figure, a region on a low impedance side (the left side of the admittance chart) is enlarged. The following description will be directed to circuit and structural parameters of the radio frequency amplifier circuit 1 whose impedance transformation is measured in the admittance chart shown in this figure, as well as the results of the impedance transformation.

As the transistor 101, GaN-HFET having a gate width Wg of 48 mm is used, and its operating frequency is set to 2.14 GHz. The output impedance of the transistor 101 is, for example, Zout=(1.5−j2.0)Ω. The output of the transistor 101 is connected to the second distributed constant line 104 via the fourth wire 124. Both of the fourth wire 124 and the second distributed constant line 104 are inductive elements connected in series. Similarly, the second distributed constant line 104 is connected to the first distributed constant line 105 via the first wire 121. Both of the first wire 121 and the first distributed constant line 105 are inductive elements connected in series. Therefore, the output impedance at $Z_1$ indicated in FIG. 1 is transformed from Zout to $Z_1$ on the admittance chart of FIG. 4. In this case, a dielectric substrate having a relative dielectric constant of 9.8 and a thickness of 0.5 mm is used as the second distributed constant line 104. The length of the second distributed constant line 104 is 1.2 mm, the line width thereof on the side of the transistor 101 is 6.0 mm, and the line width thereof on the side of the first distributed constant line 105 is 2.5 mm. Further, a dielectric substrate having a relative dielectric constant of 93 and a thickness of 0.5 mm is used as the first distributed constant line 105. The length of the first distributed constant line 105 is 2.9 mm, and the line width thereof is 2.5 mm.

Moreover, the first distributed constant line 105 is connected to the capacitive element 108 via the lead terminal 106 and the third wire 123. Here, the capacitive element 108 and the first distributed constant line 105 are formed on a single substrate. Both of the space between the first distributed constant line 105 and the capacitive element 108 and the space between the capacitive elements 108 are 150 μm. The pattern dimension of the capacitive element 108 is 500 μm×750 μm. As shown in the circuit configuration of FIG. 1, the capacitive elements 108 are connected in parallel with the signal path. Accordingly, the output impedance at $Z_2$ indicated in FIG. 1 is transformed to $Z_2$ represented in FIG. 4 by the third wire 123 and the capacitive elements 108.

Further, the lead terminal 106 is connected to the first distributed constant line 105 via the second wire 122 and connected to the capacitive element 108 via the third wire 123. Thus, the output impedance at $Z_3$ serving as an output terminal of the package is transformed to a high impedance. As a result, the output impedance is transformed up to (8.1+j2.6)Ω in the present embodiment.

From the results above, the output impedance of the transistor 101 is transformed, for example, from (1.5−j2.0)Ω to a high impedance of (8.1+j2.6)Ω by the output-side matching circuit 103 according to the present embodiment. The above results show that the radio frequency amplifier circuit 1 according to Embodiment 1 of the present invention both miniaturize the matching circuit and ensure the device performance.

Although the present embodiment has discussed that the output-side matching circuit 103 is constituted by the second distributed constant line 104, the first distributed constant line 105, the lead terminal 106, the first wire 121 to the fourth wire 124 and the capacitive element 108, the configuration of the output-side matching circuit 103 is not limited to the above. Also, the length and width of the distributed constant lines described above may be changed according to devices to be used. Additionally, the dielectric substrate constituting the first distributed constant line 105 and the second distributed constant line 104 also may be a dielectric substrate having a relative dielectric constant other than the relative dielectric constant illustrated above. For example, as the dielectric substrate, it may be possible to form an insulating layer of $SiO_2$ or the like on a high resistance Si substrate and form an electrically conductive layer pattern thereon. Alternatively, a GaAs substrate or the like may be used. Further, although the total of six capacitive elements 108 is depicted in the layout of FIG. 2, the number, dimension and configuration thereof are merely an example. Similarly, although the input-side matching circuit 102 is constituted by the two-stage wires and the third distributed constant line 109, there is no limitation to this.

Moreover, considering the viewability of the figure, the package 112 formed of a resin is shown to have a frame shape such that the circuit configuration inside the package can be viewed. However, the process of sealing by resin potting is added in practice. In this manner, an insert molding method can be used for the sealing method. Alternatively, a transfer molding method may be utilized in which the transistor 101, the input-side matching circuit 102 and the output-side matching circuit 103 are mounted on the base substrate 107, and then, a mold is set from upper and lower sides, followed by sealing through the resin infusion into the mold.

Figure 5:
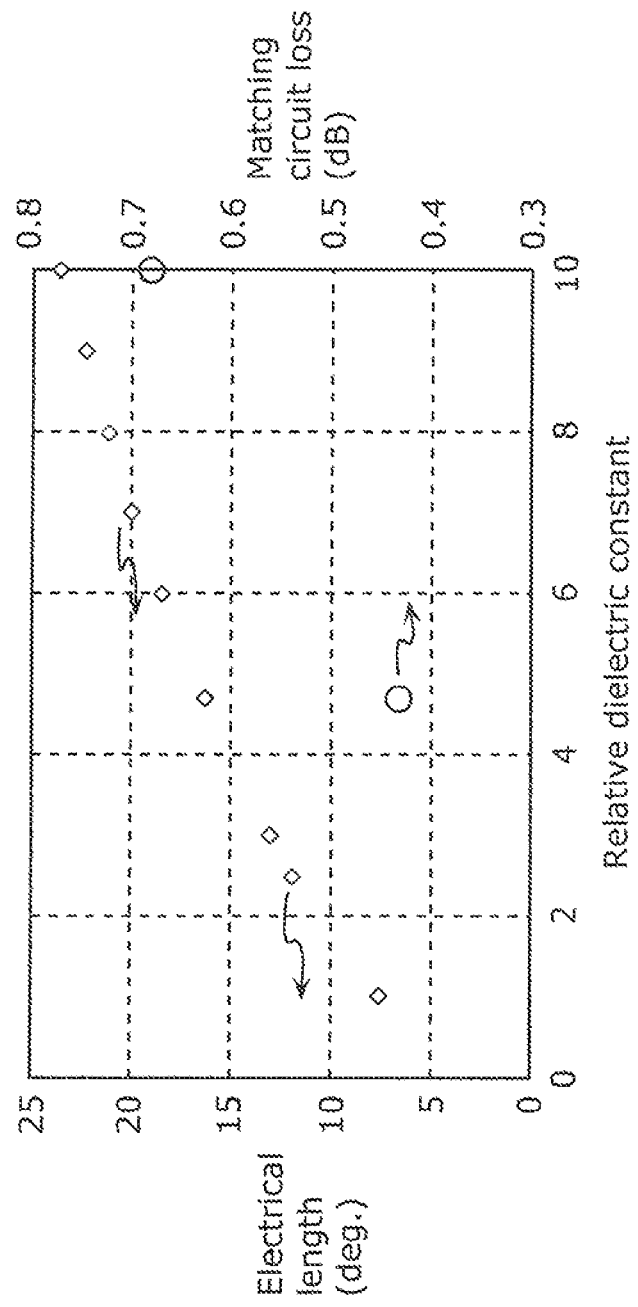
FIG. 5 is a graph showing the relationship of a relative dielectric constant with an electrical length and a matching circuit loss in a package according to Embodiment 1.

FIG. 5 is a graph showing the relationship of a relative dielectric constant with an electrical length and a matching circuit loss in the package according to Embodiment 1. This figure shows the results of calculating the electrical length of the transmission line and the loss of the output matching circuit 103 when the relative dielectric constant of the sealing resin 110 covering the lead terminal 106 is varied. It is noted that, as the condition for calculating the electrical length, the length of the transmission line is set to 3 mm. As indicated in this figure, in the case of a relative dielectric constant of 10, which is a constant close to the constant of a general ceramic, the electrical length is 23.6°. On the other hand, when the material of the package 112 is the resin (with a relative dielectric constant of 4.7) used in the present embodiment, the electrical length of 16.7° is achieved, which is about 7° shorter than the case above.

Under the condition described above, the pass characteristics (S21) of the output-side matching circuit 103 is calculated using a circuit simulator. The result is that, when the relative dielectric constant is 10, the matching circuit loss is 0.68 dB. On the other hand, when the relative dielectric constant is 4.7, the matching circuit loss is 0.43 dB. Accordingly, the output-side matching circuit 103 according to the present embodiment achieves an improvement of approximately 0.25 dB. Furthermore, when converted to input and output characteristics of the transistor 101, the improvement is that the power loss is reduced by 0.25 dB for the same input power. In other words, the gain of the transistor 101 is considered to increase by 0.25 dB. Here, when the relative dielectric constant is 10, for example, it is assumed that the gain is 15.75 dB and the drain efficiency is 70%. Then, by setting the relative dielectric constant to 4.7, it is possible to improve the gain to 16.0 dB and the drain efficiency to 74.5%. Likewise, when the output is assumed to be 100 W in the case of a relative dielectric constant of 10, by setting the relative dielectric constant to 4.7, the gain is improved by 0.25 dB, so that the output is improved to 106 W. Therefore, with the above-described configuration, it becomes possible to ensure the device performance without causing any characteristic degradation even when the layout of a fundamental matching circuit is miniaturized.

EMBODIMENT 2

Figure 6:
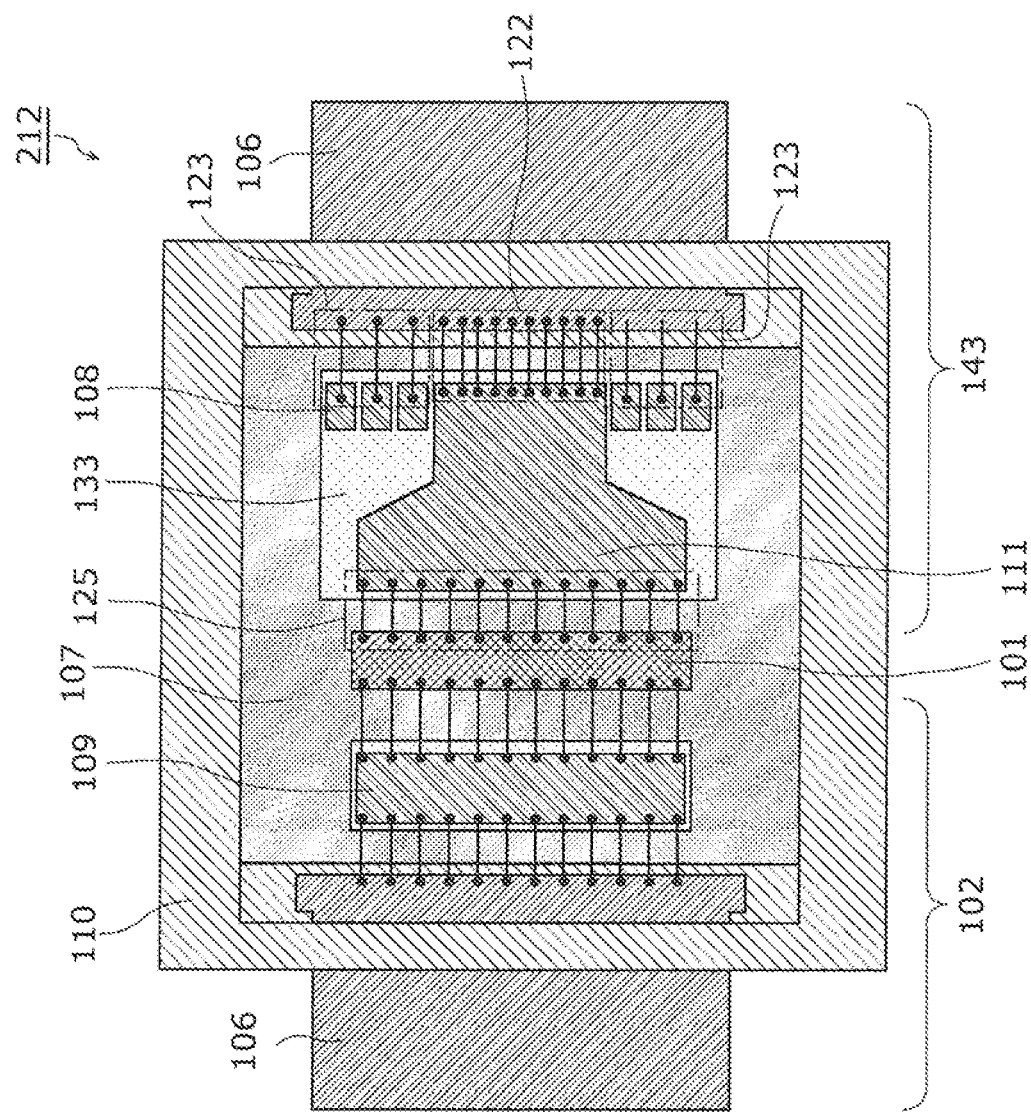
FIG. 6 illustrates a layout of a radio frequency amplifier circuit according to Embodiment 2.

FIG. 6 illustrates a layout of a radio frequency amplifier circuit according to Embodiment 2. The radio frequency amplifier circuit according to the present embodiment is constituted by a transistor 101, an input-side matching circuit 102 and an output-side matching circuit 143. The radio frequency amplifier circuit according to the present embodiment is different from the radio frequency amplifier circuit 1 according to Embodiment 1 only in the configuration of the distributed constant line in the output-side matching circuit. The following description will be focused on points different from the radio frequency amplifier circuit 1 according to Embodiment 1.

The output-side matching circuit 143 includes a first distributed constant line 111, a lead terminal 106 for transmitting a signal to an outside of a package 212 receiving the radio frequency amplifier circuit and a capacitive element 108. An output terminal of the transistor 101 and an input side of the first distributed constant line 111 are connected by a first wire 125. An output side of the first distributed constant line 111 and an input side of the lead terminal 106 are connected by a second wire 122. One electrode of the capacitive element 108 and the input side of the lead terminal 106 are connected by a third wire 123. Further, the other electrode of the capacitive element 108 is grounded.

With the configuration described above, it is sufficient to mount the transistor 101, a dielectric substrate on which a third distributed constant line 109 is formed, and a dielectric substrate 133 on which the first distributed constant line 111 and the capacitive element 108 are formed on a mounting surface, which is a surface of a base substrate 107. Also, since the lead terminal 106 can be integrally molded in advance with a sealing resin 110 formed of a resin, it is possible to reduce the number of substrate mounting processes on the above-noted mounting surface. This can reduce a mounting displacement of the substrate, thus improving a mounting accuracy. Further, it is also possible to reduce the number of wire groups for connecting the distributed constant lines. Consequently, in addition to achieving the miniaturization and ensuring the matching circuit performance, it is also possible to contribute to cost reduction.

EMBODIMENT 3

The present embodiment will be directed to a radio frequency amplifier circuit having a matching circuit in which a plurality of unit transmission lines, each having a dielectric distributed constant line and a capacitive element connected in parallel with a lead terminal, are provided in parallel.

Figure 7:
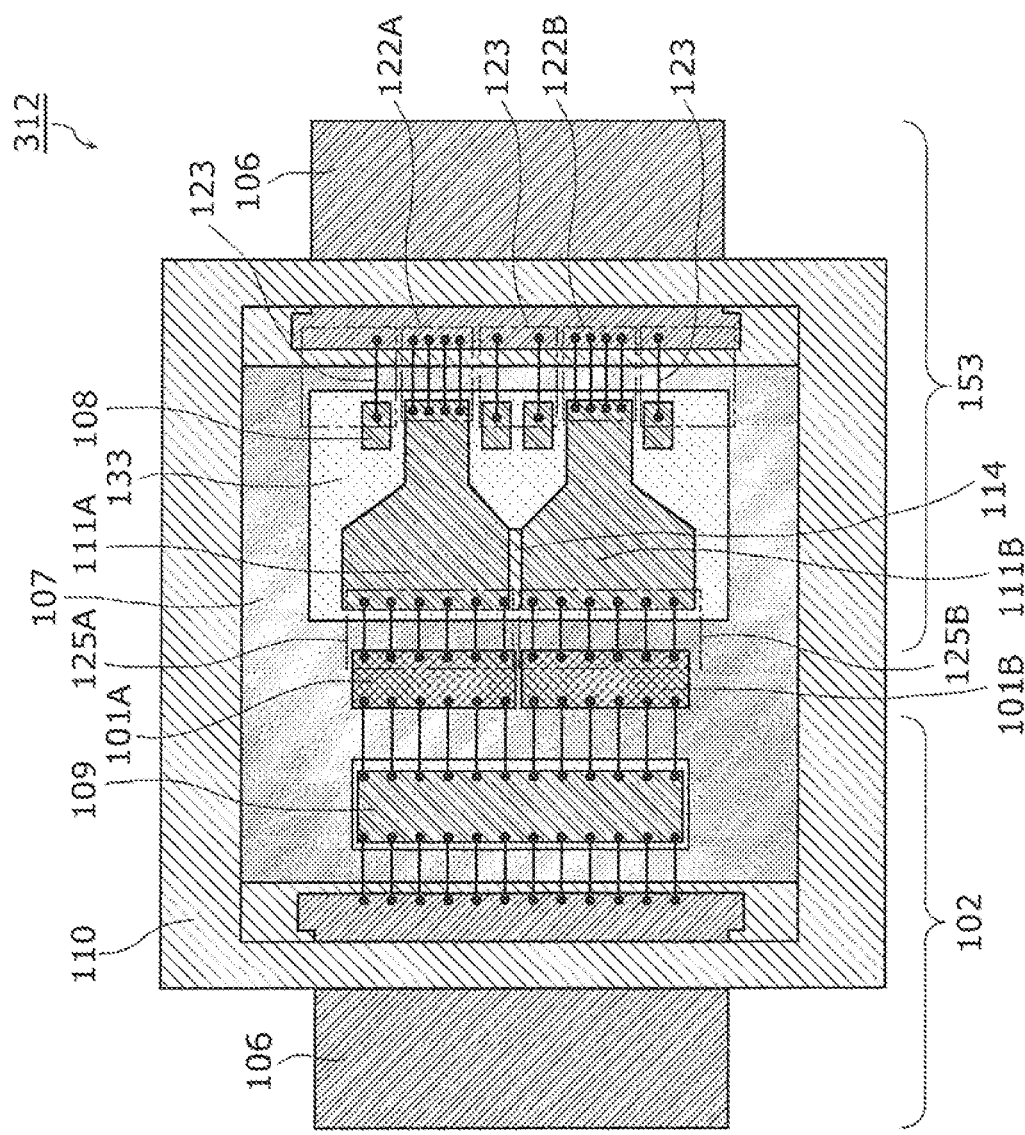
FIG. 7 illustrates a layout of a radio frequency amplifier circuit according to Embodiment 3.
Figure 8:
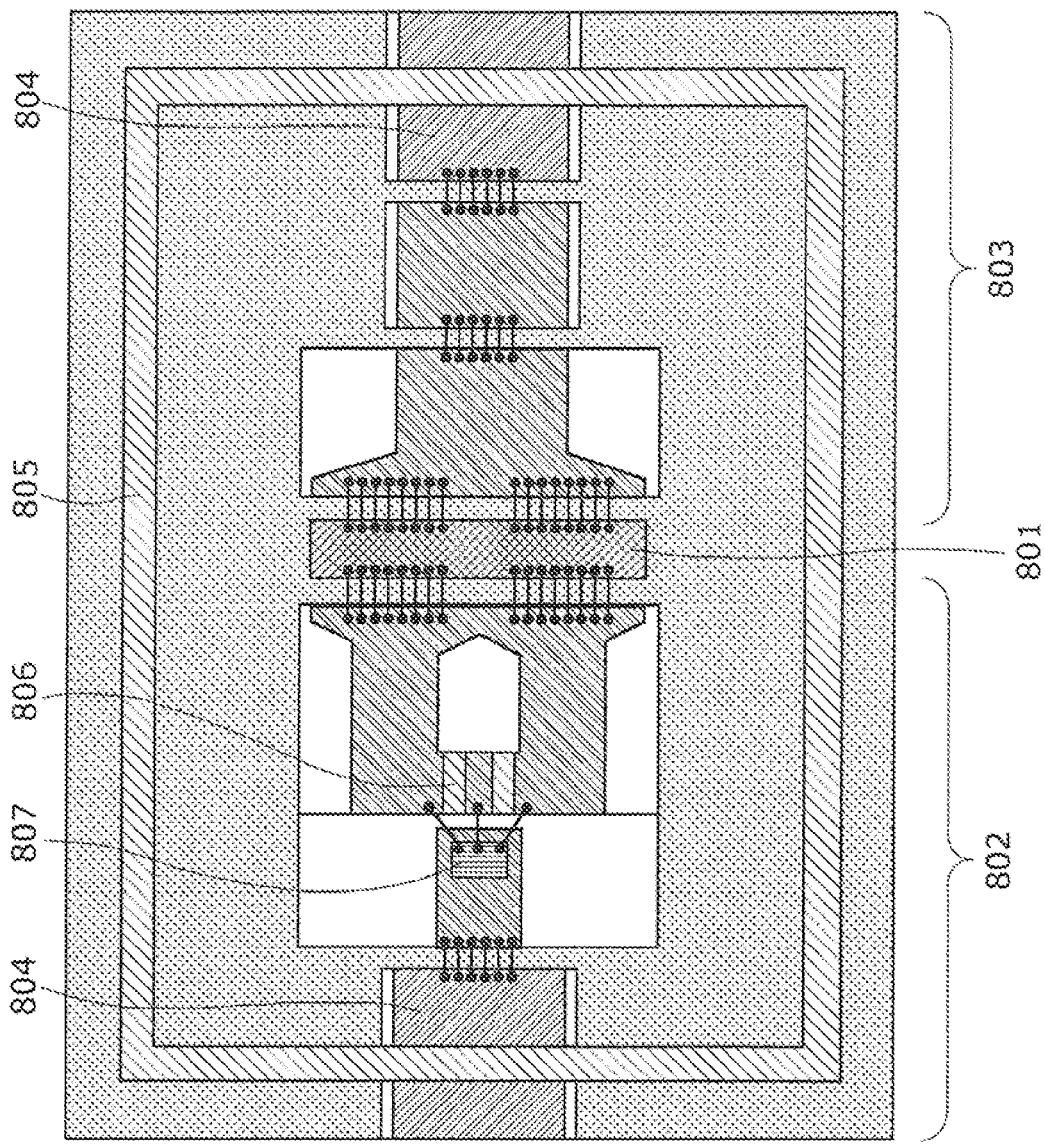
FIG. 8 illustrates a configuration inside a package of a conventional radio frequency amplifier circuit described in PTL 1.
Figure 9A:
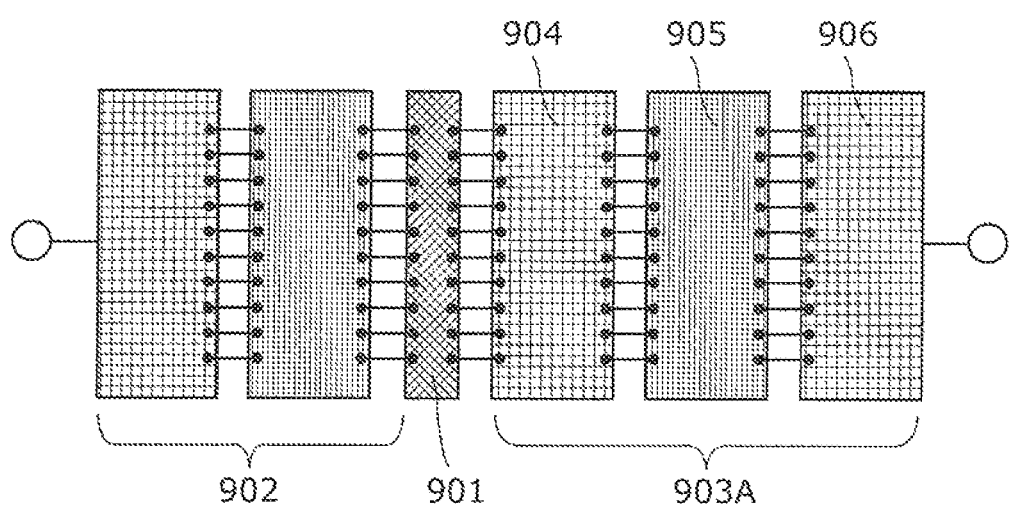
FIG. 9A illustrates a first configuration of a conventional radio frequency amplifier circuit described in PTL 2.
Figure 9B:
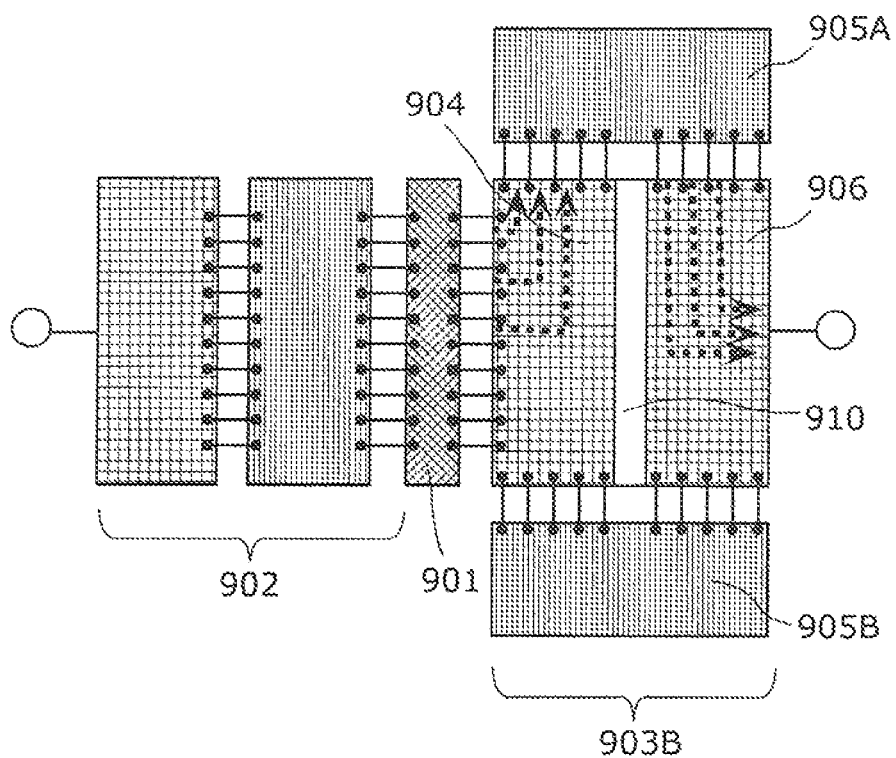
FIG. 9B illustrates a second configuration of the conventional radio frequency amplifier circuit described in PTL 2.

FIG. 7 illustrates a layout of a radio frequency amplifier circuit according to Embodiment 3. The radio frequency amplifier circuit according to the present embodiment is constituted by transistors 101A and 101B, an input-side matching circuit 102 and an output-side matching circuit 153. The radio frequency amplifier circuit according to the present embodiment is different in configuration from the radio frequency amplifier circuit according to Embodiment 2 in that a matching circuit is disposed on an output side of each of a plurality of the transistors. The following description will be focused on points different from the radio frequency amplifier circuit 2 according to Embodiment 2.

In FIG. 7, the output-side matching circuit 153 includes first distributed constant lines 111A and 111B, a lead terminal 106 for transmitting a signal to an outside of a package 312 receiving the radio frequency amplifier circuit, and a capacitive element 108. An input side of the first distributed constant line 111A is connected to an output terminal of the transistor 101A via a first wire 125A. An output side of the first distributed constant line 111A and an input side of the lead terminal 106 are connected by a second wire 122A. One electrode of the capacitive element 108 and the input side of the lead terminal 106 are connected by a third wire 123. Further, the other electrode of the capacitive element 108 is grounded. Moreover, an input side of the first distributed constant line 111B is connected to an output terminal of the transistor 101B via a first wire 125B. An output side of the first distributed constant line 111B and the input side of the lead terminal 106 are connected by a second wire 122B. The first distributed constant lines 111A and 111B have a line width that is about the same as a longitudinal length of the transistors 101A and 101B respectively (Wg=24 mm in the above example) on a side close to the transistors. Furthermore, the first distributed constant lines 111A and 111B and the capacitive element 108 are formed of a single dielectric substrate 133.

In other words, a plurality of the unit transmission lines constituted by each of the first distributed constant lines and the capacitive element 108 are disposed in parallel between the transistor and the lead terminal 106.

For example, in the transistor having a gate width Wg of 48 mm, when the unit gate length is set to 0.8 mm, the longitudinal size of the transistor is about 6 mm, which is very large. In the case of mounting the large-size transistor 101 as described above on the base substrate 107, the transistor 101 warps easily, so that the adhesion between the base substrate 107 and the transistor 101 may become insufficient. Especially at the time of high power operation, the high temperature of the transistor 101 causes characteristic failure and destruction of the transistor 101 if the adhesion between the transistor 101 and the base substrate 107 is too poor to dissipate heat. In order to cope with the above problem, instead of setting a gate width Wg of 48 mm in one transistor so as to achieve a high power, it may be conceivable to adopt the configuration in which, for example, two transistors are disposed in parallel. In this case, the gate width Wg of each transistor is set to 24 mm, for example. Then, the outputs of the two transistors are combined. The layout shown in FIG. 7 is an exemplary configuration of the output-side matching circuit in which two-chip combination has been carried out as described above.

With the configuration described above, the output-side matching circuit 153 is formed on the single dielectric substrate 133, thus facilitating mounting. Further, since the chip size of the transistors 101A and 101B is reduced, the warping of each transistor is suppressed, so that the adhesion between the base substrate and each transistor improves. This makes it possible to improve the heat dissipating performance of each transistor. Therefore, the mounting yield increases, thus achieving a lower cost. Moreover, in the configuration where power combination is carried out away from the transistors 101A and 101B as in the present embodiment, oscillations sometimes destabilize the transistor performance. As the configuration for preventing the above-noted oscillations, the first distributed constant lines 111A and 111B may be connected via a resistor 114. In other words, the adjacent unit transmission lines mentioned above may be connected via the resistor 114.

It should be noted that the mode of connection between the first distributed constant lines 111A and 111B and the lead terminal 106 as well as the number of divided capacitive elements 108 are not limited to the layout shown in FIG. 7. For example, as in the layout shown in FIG. 2, three capacitive elements 108 may be disposed on each external side, or more capacitive elements 108 may be disposed thereon. In other words, determination is made depending on the matching characteristics required for the output-side matching circuit 153.

Although the radio frequency amplifier circuit according to the present invention has been described above based on the embodiments, the present invention is not limited to the above-mentioned embodiments. Various modifications that can be arrived at by a person skilled in the art without departing from the summary of the present invention are also included in the scope of the present invention. Further, any combinations of individual structural components in a plurality of the embodiments may be made without departing from the purport of the present invention.

INDUSTRIAL APPLICABILITY

The radio frequency amplifier circuit according to the present invention is applicable to a base station for mobile communications that deals with a radio frequency signal at a high power, a microwave home electrical appliance such as a microwave oven, or the like.

REFERENCE SIGNS LIST

1 Radio frequency amplifier circuit
101, 101A, 101B, 801, 901 Transistor
102, 802, 902 Input-side matching circuit
103, 143, 153, 803, 903A, 903B Output-side matching circuit
104 Second distributed constant line
105, 111, 111A, 111B First distributed constant line
106, 804 Lead terminal
107 Base substrate
108 Capacitive element
109 Third distributed constant line
110 Sealing resin
112, 212, 312 Package
113 Measurement jig
114, 806 Resistor
121, 125, 125A, 125B First wire
122, 122A, 122B Second wire
123 Third wire
124 Fourth wire
131, 132, 133 Dielectric substrate
805 Package frame
807 Capacitor
904, 905A, 905B, 906 Distributed constant line
910 High-dielectric substrate

The invention claimed is:

1. A radio frequency amplifier circuit comprising, on a mounting surface inside a package:
   a transistor amplifying a radio frequency signal;
   an input-side matching circuit; and
   an output-side matching circuit,
   wherein the output-side matching circuit includes:
      a first distributed constant line to which the radio frequency signal from the transistor is transmitted via a plurality of first wires arranged in parallel;
      a lead terminal in a flat plate shape to which the radio frequency signal from the first distributed constant line is transmitted via a plurality of second wires arranged in parallel, the lead terminal transmitting the radio frequency signal to an outside of the package; and
      a capacitive element having one electrode that is connected to the lead terminal via a third wire and another electrode that is grounded,
   the lead terminal is partially joined to a sealing resin having a lower dielectric constant than the first distributed constant line, and
   the capacitive element and the first distributed constant line are disposed adjacent to each other, with an alignment direction of the capacitive element and the first distributed constant line intersecting, on the mounting surface, an alignment direction of the first distributed constant line and the lead terminal.

2. The radio frequency amplifier circuit according to claim 1, further comprising
   a second distributed constant line disposed between the first distributed constant line and the transistor, the second distributed constant line being connected to the transistor via a plurality of fourth wires arranged in parallel and being connected to the first distributed constant line via the plurality of first wires.

3. The radio frequency amplifier circuit according to claim 1,
   wherein the first distributed constant line and the capacitive element are formed of a single continuous dielectric substrate.

4. The radio frequency amplifier circuit according to claim 1,
   wherein the capacitive element comprises a plurality of capacitive elements, and
   the plurality of capacitive elements are disposed symmetrically on both sides along the intersecting direction of the first distributed constant line.

5. The radio frequency amplifier circuit according to claim 1,
   wherein the transistor comprises a plurality of transistors, and
   a plurality of unit transmission lines, each of which is constituted by the first distributed constant line and the capacitive element and provided for a different one of the plurality of transistors, are disposed in parallel between the plurality of transistors and the lead terminal.

6. The radio frequency amplifier circuit according to claim 5,
   wherein the unit transmission lines that are adjacent to each other are connected via a resistor.

7. The radio frequency amplifier circuit according to claim 2,
   wherein the first distributed constant line and the capacitive element are formed of a single continuous dielectric substrate.

* * * * *